(12) United States Patent
Hartman et al.

(10) Patent No.: US 10,251,303 B2
(45) Date of Patent: Apr. 2, 2019

(54) SERVER DISPLAY FOR DISPLAYING SERVER COMPONENT INFORMATION

(71) Applicant: DELL PRODUCTS, LP, Round Rock, TX (US)

(72) Inventors: Corey D. Hartman, Hutto, TX (US); Stuart Allen Berke, Austin, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/587,893

(22) Filed: May 5, 2017

(65) Prior Publication Data

US 2018/0324973 A1   Nov. 8, 2018

(51) Int. Cl.
*G06F 1/18* (2006.01)
*G06F 11/32* (2006.01)
*H05K 7/14* (2006.01)

(52) U.S. Cl.
CPC .......... *H05K 7/1494* (2013.01); *G06F 1/186* (2013.01); *G06F 11/324* (2013.01); *H05K 7/1498* (2013.01)

(58) Field of Classification Search
CPC .............................. G06F 1/186; G06F 11/324
See application file for complete search history.

(56) References Cited

U.S. PATENT DOCUMENTS

| | | | | |
|---|---|---|---|---|
| 5,483,229 A * | 1/1996 | Tamura | ............... | H05K 7/1468 340/691.7 |
| 5,601,349 A * | 2/1997 | Holt | ............... | G06F 1/184 174/67 |
| 5,754,112 A * | 5/1998 | Novak | ............... | G06F 11/325 340/332 |
| 5,790,374 A * | 8/1998 | Wong | ............... | G02B 6/0005 361/679.32 |
| 5,822,196 A * | 10/1998 | Hastings | ............... | G06F 1/184 361/679.58 |
| 6,747,874 B2 * | 6/2004 | McKinnon | ............... | H04Q 1/06 211/26 |
| 6,867,701 B2 * | 3/2005 | Lawrence | ............... | H05K 7/20836 340/3.43 |
| 7,129,851 B1 * | 10/2006 | Garnett | ............... | G06F 1/18 340/815.4 |
| 7,259,683 B2 * | 8/2007 | Abe | ............... | G11B 33/10 116/200 |
| 7,812,737 B1 * | 10/2010 | Hunter | ............... | H01R 13/7175 340/687 |
| 8,576,570 B2 * | 11/2013 | Nguyen | ............... | G06F 1/181 361/725 |
| 9,250,649 B2 | 9/2016 | Shabbir et al. | | |
| 2003/0018843 A1 * | 1/2003 | Cooper | ............... | G06F 13/409 710/302 |
| 2008/0012717 A1 * | 1/2008 | Chen | ............... | G06F 11/324 340/653 |
| 2008/0065805 A1 * | 3/2008 | Wu | ............... | G06F 1/186 710/301 |

FOREIGN PATENT DOCUMENTS

CN          103941113 A  *  7/2014

* cited by examiner

*Primary Examiner* — Adrian S Wilson
(74) *Attorney, Agent, or Firm* — Larson Newman, LLP

(57) ABSTRACT

A server includes slots for adding peripheral devices, and a server chassis having a openings corresponding to the slots. A display mounted on the server chassis proximate the opening displays slot characteristics, slot status information, or user defined information corresponding to the slots.

20 Claims, 11 Drawing Sheets

US 10,251,303 B2

SERVER DISPLAY FOR DISPLAYING SERVER COMPONENT INFORMATION

FIELD OF THE DISCLOSURE

This disclosure generally relates to information handling systems, and more particularly relates to servers and determining a status of a server slot and a device.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

An example of an information handling system may be a server with slots for peripheral devices.

SUMMARY

A server may include a set of slots for adding peripheral devices, and a server chassis having a set of openings corresponding to the set of slots. A display mounted on the server chassis proximate the opening displays slot characteristics, slot status information, or user defined information corresponding to the slots.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
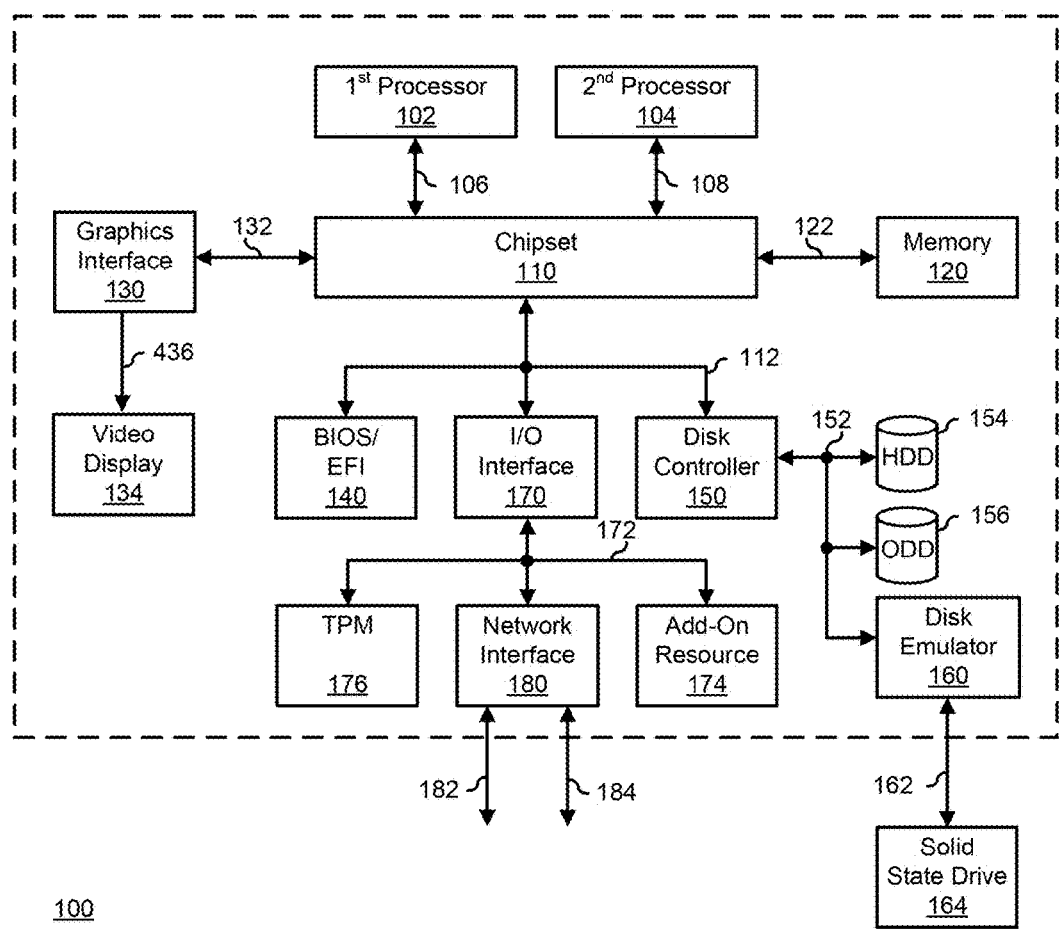
FIG. 1 is a block diagram illustrating a generalized information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a processor system which may be a System-on-a-Chip (SoC), a personal computer, a laptop computer, a smart phone, a tablet device or other consumer electronic device, storage array, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a SoC, or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to the chipset via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174, to a TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

An example of an information handling system is a server. A server may have a server chassis defining a physical shape and outline of the server. The server may include a motherboard interior to the server chassis, the motherboard supporting a baseboard management controller (BMC) of the server. A BMC may be considered a specialized service processor that monitors the physical state of a server or other hardware devices. The BMC of the server may interface with, for example, monitor, control or configure components of the server. For example, a server may exhibit modularity and one or more components may be added to the server, and these components may be monitored by the BMC.

A server may have one or more connections or sets of connections for adding one or more components such as modular peripheral devices to the server. These peripheral devices may include Input/Output (IO) devices which may be used by the server to connect to and communicate with a network or may includes memory devices, such as solid state devices (SSDs), for example. The server chassis may have one or more openings to allow for access to these peripheral devices when the peripheral devices are added to the server.

For example, a connection or set of connections may be a physical slot connection, for example, a peripheral card connector, into which a portion of a peripheral device is inserted to add the peripheral device to the server as a server component. A peripheral card connector may provide mechanical support to a peripheral device inserted into the peripheral card connector to maintain the peripheral device in a position, for example in a vertical or horizontal position. A server and server chassis may be considered to have a set of slots, each slot of the set of slots having a peripheral card connector to add a peripheral device to the server. A slot is a physical space in a server into which a peripheral device may be added, or slotted, into the server, for example by sliding a connection portion of the peripheral device into the peripheral card connector of the slot. A slot may have a corresponding opening in the server chassis to allow for access to the peripheral device inhabiting the slot.

A slot may be a universal slot and the peripheral card connector may have a common connection footprint, and the added peripheral device may be added to the server as a server component and interface with server via the universal slot and connection thereto. A universal slot may have a common physical footprint and provide a common set of connections with card connectors of the same specification. Thus, a server may have multiple universal slots to allow flexibility to add different peripherals as server components. The slots may generally be located in a portion of the server near the walls of the server chassis, and the server chassis have an opening in the vicinity of the slots such that peripherals coupled to the slots may be at least visually accessible by a viewer of the server. Individual slots may have different characteristics despite the universal connection footprint, for example, different communication protocols and versions of the communication protocols may be supported by the individual slot.

While a universal slot may have a standard or universal, that is common, physical footprint, and common connector, the server may interface with the peripheral device inserted into the slot according to different communication protocols, different versions of communication protocols, or different speeds of communication of communication protocols over the common connector. For example, the bus structure and hardware of an individual server and individual peripheral may support varying higher (or lower) communication speeds between the individual server and individual peripheral, and the server and peripheral may communicate according to those higher communication speeds as allowed by the communication protocol. Also, device performance may degrade over time, or it may be desirable to have communications between peripheral and server use an older version or different standard and these setting may be made to peripheral and server, while the physical footprint and the physical connector of the universal slot will remain the same.

Thus, it may be desirable to have a display indicating information about the individual slot, the peripheral in a slot and server-peripheral characteristics, for example, the communication protocol or version thereof used with the peripheral by the server. In common server embodiments, slots are positioned towards the rear, or located in the rear portion of the server. There are usually one or more openings in the server chassis to allow at least visual access to the peripherals inserted into the slots. As discussed above, these peripherals may add IO capability to the server and so may include one or more ports for network connections which may be accessed through the server chassis openings. The display may be located proximate a server chassis opening corresponding to a universal slot and indicate information relating to that slot, such as slot characteristics, characteristics of the peripheral in the slot, characteristics of communication between peripheral and server or network, or other characteristics.

The display may be directly mounted on the server chassis, by for example, a housing mounted on the server, and the display may be connected to the BMC of the server and controlled and configured by the BMC. The display may include a set of light emitting diodes (LEDs), may be an LCD display, or an Electronic-ink display, or other display type or combination of display types. In embodiments, it may be desirable to have the display maintain the displayed content event when the server is off or quiescent. Thus, the display may be a semi-permanent type of display which maintains display information on the display even when the display is unpowered, or receiving minimal power from a quiescent server.

Figure 2:
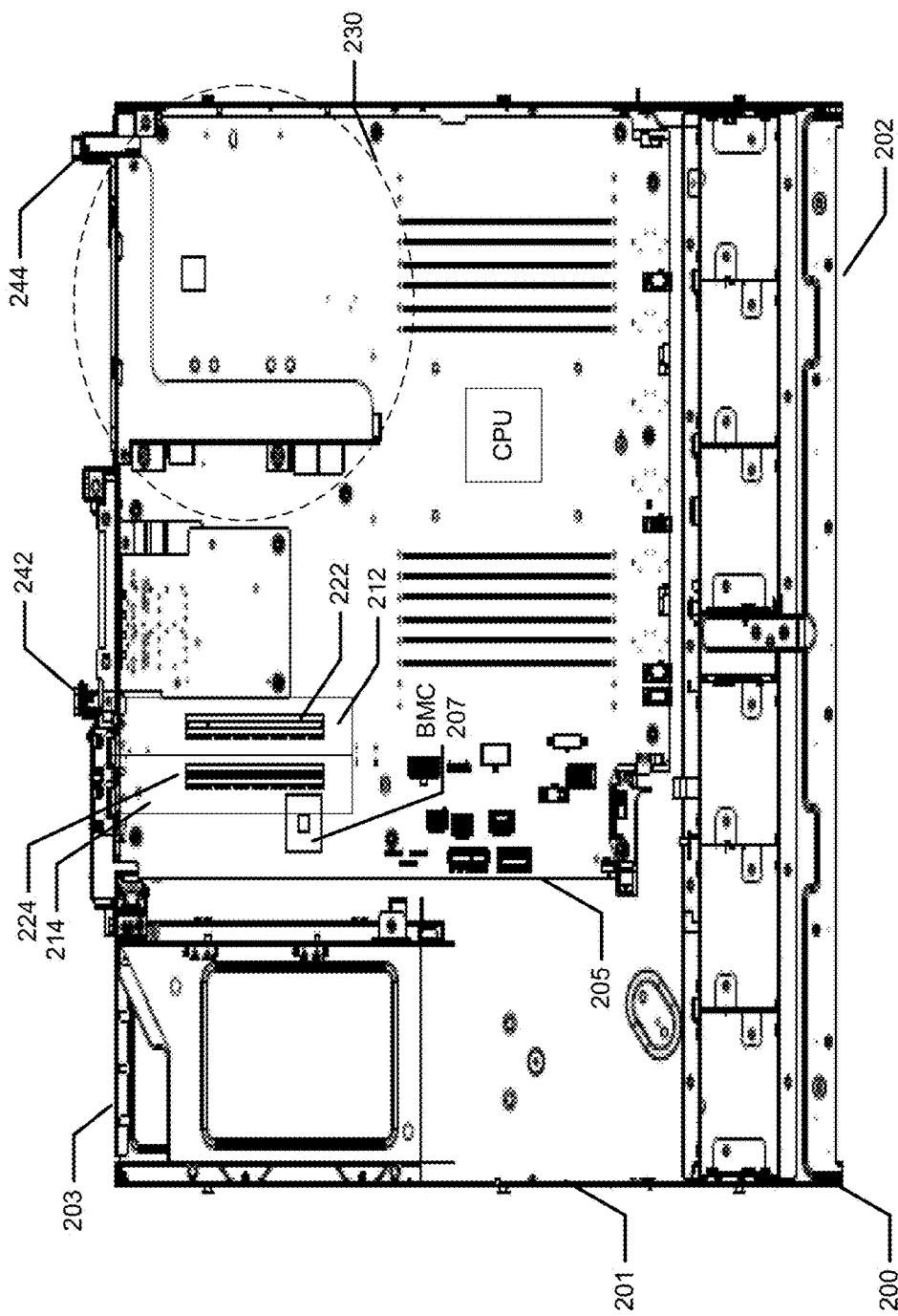
FIG. 2 illustrates a top view of a server according to an embodiment of the present disclosure.

FIG. 2 shows a top view of a server 200. Server 200 includes server chassis 201 defining the physical footprint and dimensions of server 200. The portion of server chassis indicated by 202 may be considered the front of server 200, and portion of server chassis indicated by 203 may be considered the back of server 200. Server 200 includes motherboard 205, BMC 207, slots 212 and 214, and riser 230 providing one or more horizontal expansion slots. As can be seen from this top view provided by FIG. 2, slots 212 and 214, and vertical riser 230 are positioned towards the back of server 200 and abut back 203 of server 200. BMC 207 is mounted on motherboard 205. Slot 212 includes peripheral card connector 222 and slot 214 includes peripheral card connector 224. BMC 207 may be aware of the communication protocols supported by slots 212 and 214.

A display 242 is mounted on server chassis 201 proximate to slots 212 and 214. Display 242 is mounted to back 203 of server 200. Display 242 may be in communication with BMC 207 and controlled by BMC 207 to output information associated with slots 212 and 214. A display 244 is mounted on server chassis 201 proximate riser 230. Display 244 is mounted to back 203 of server 200.

Figure 3A:
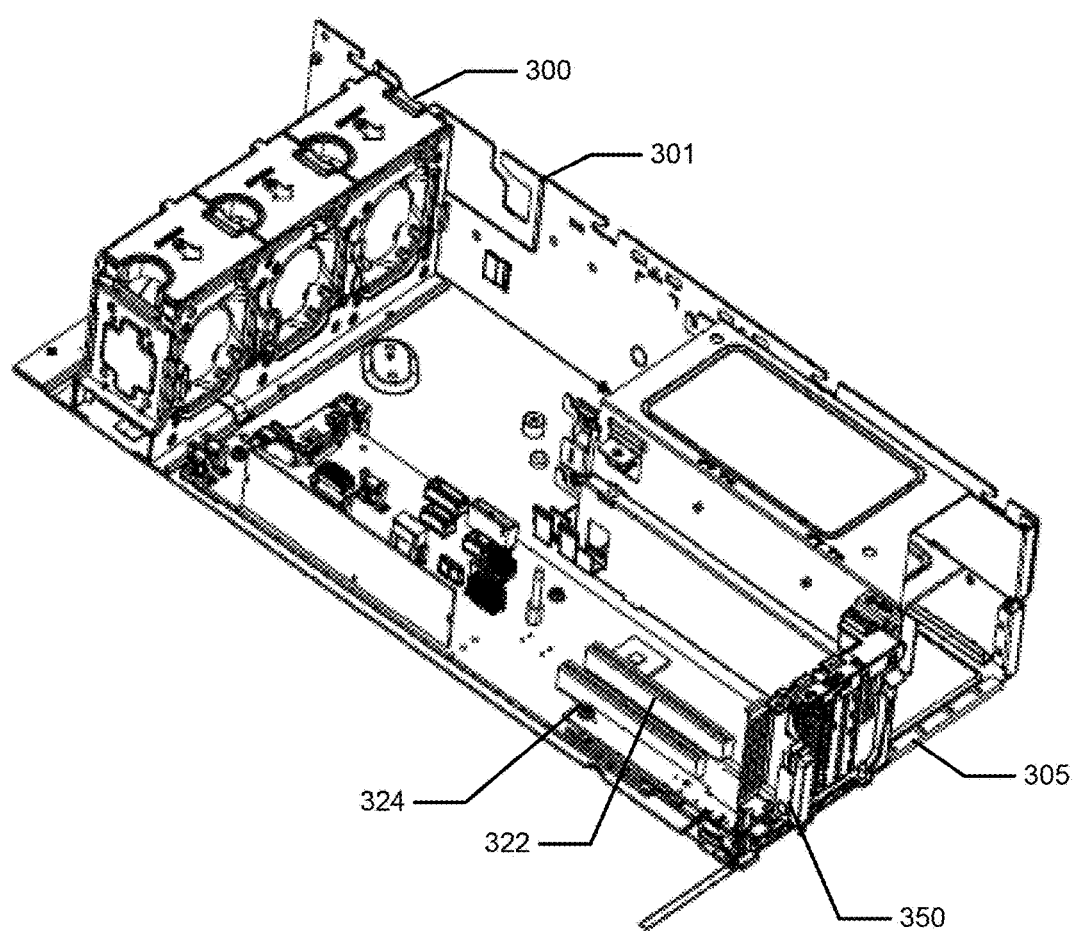
FIGS. 3a and 3b illustrate an isometric top-side angled view of a server according to an embodiment of the present disclosure.
Figure 3B:
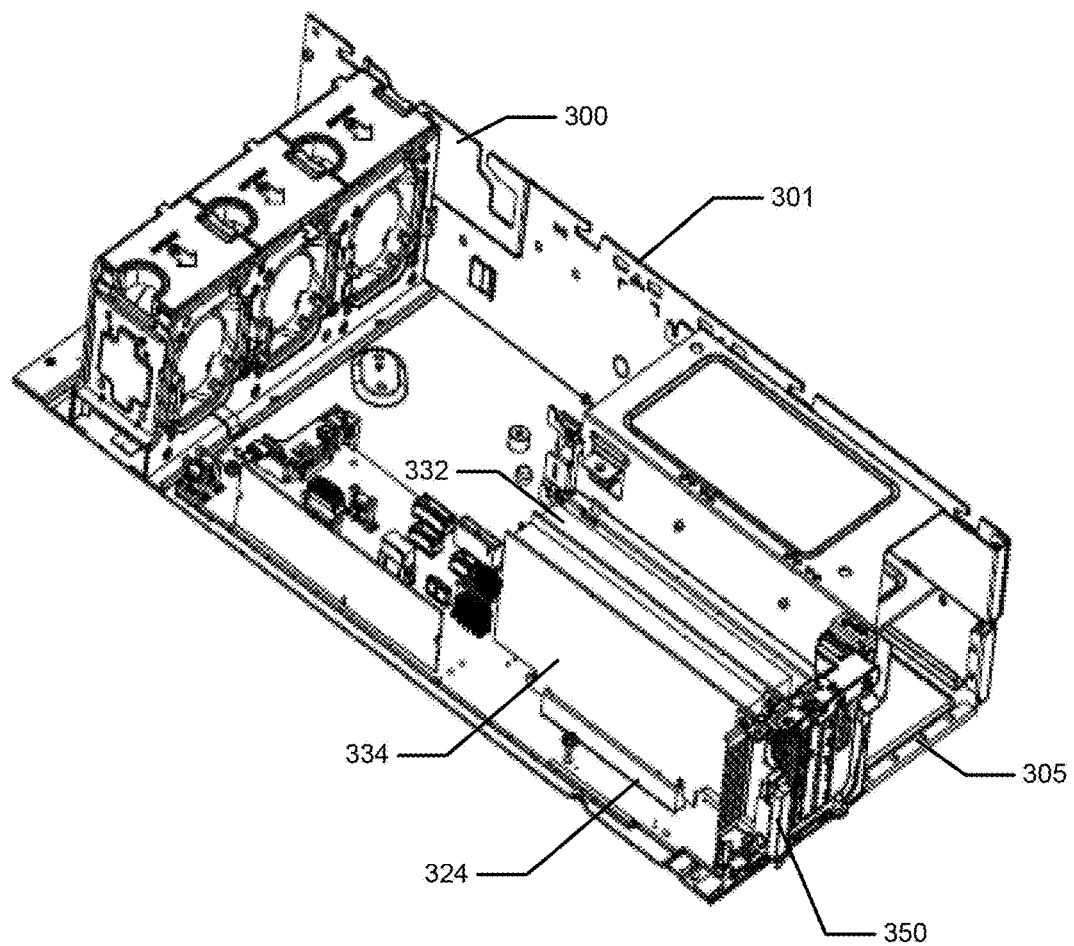

FIGS. 3a and 3b show an isometric top-side angled view of server 300. FIG. 3a shows server 300 unpopulated with peripheral devices; that is slots of server 300 are unpopulated with peripheral devices. FIG. 3b shows server 300 populated with peripheral devices; that is slots of server 300 are populated with peripheral devices. Server 300 includes server chassis portion 301 defining a physical space or footprint of server 300. 305 indicates a back of server 300 and server chassis 301.

FIG. 3a shows peripheral card connectors 322 and 324 of corresponding slots and corresponding display 350 directly mounted to server chassis 301. The slots corresponding to peripheral card connectors 322 and 324 are unpopulated, and thus peripheral card connectors 322 and 324 are unconnected, as shown in FIG. 3a.

FIG. 3b shown slots corresponding to peripheral card connectors 322 and 324 populated by peripheral devices 332 and 334, respectively. As can be seen from FIG. 3b, peripheral card connector 322 is obscured by peripheral device 334, and peripheral device 334 is mechanically connected to peripheral device connector 324. Thus, in FIG. 3b, the slots corresponding to peripheral card connectors 322 and 324 are populated by peripheral devices. And as can further be seen from FIG. 3b, display 350 is relatively proximate the slots of server 300 and peripheral devices 332 and 334 populating the slots. A BMC of server 300 may monitor the communications between server 300 and peripheral devices 332 and 334 and may be aware of the communication protocol used and communication speeds between server 300 and peripheral devices 332 and 334.

Figure 4A:
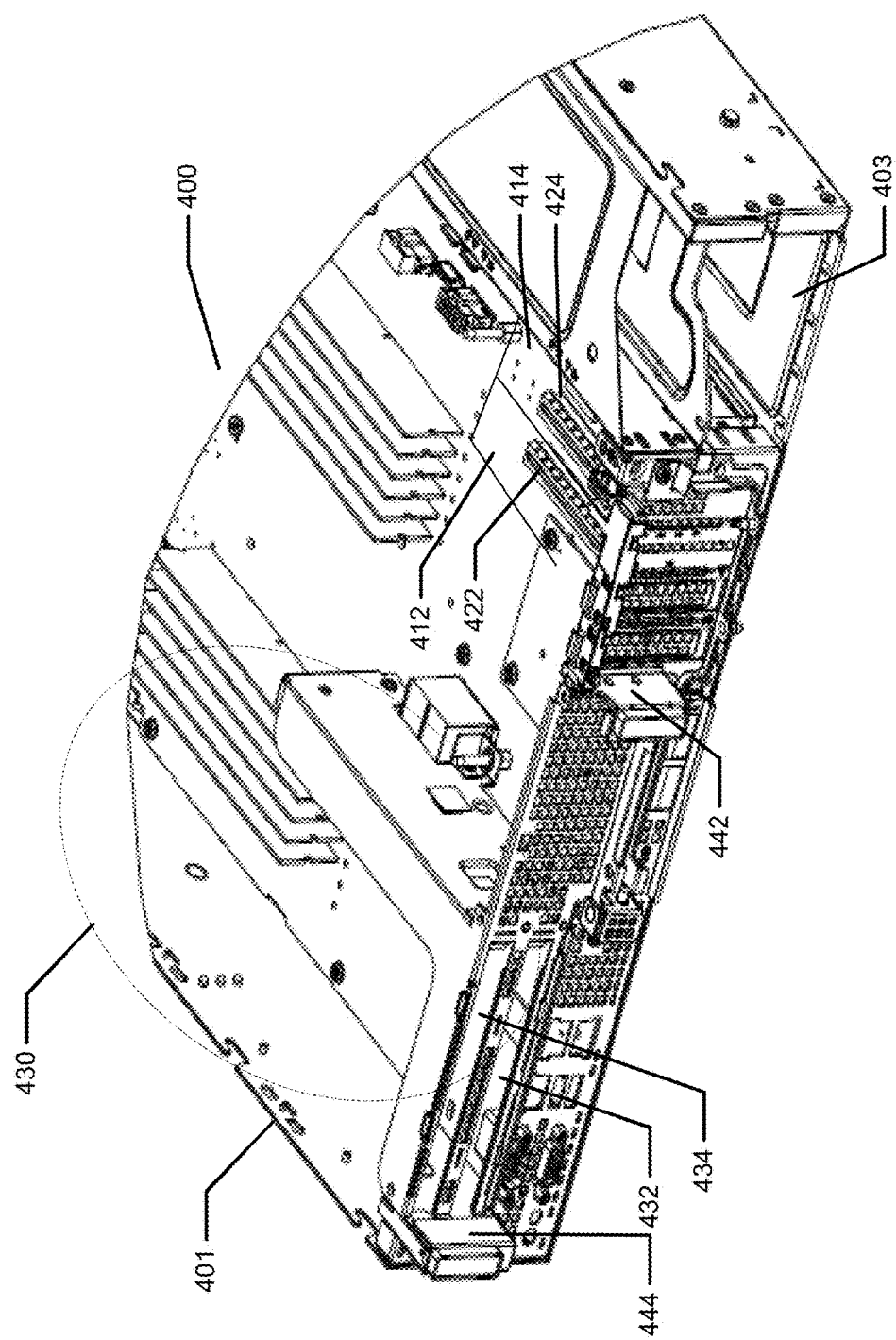
FIGS. 4a and 4b illustrate an isometric top-side angled view of a server portion according to an embodiment of the present disclosure.
Figure 4B:
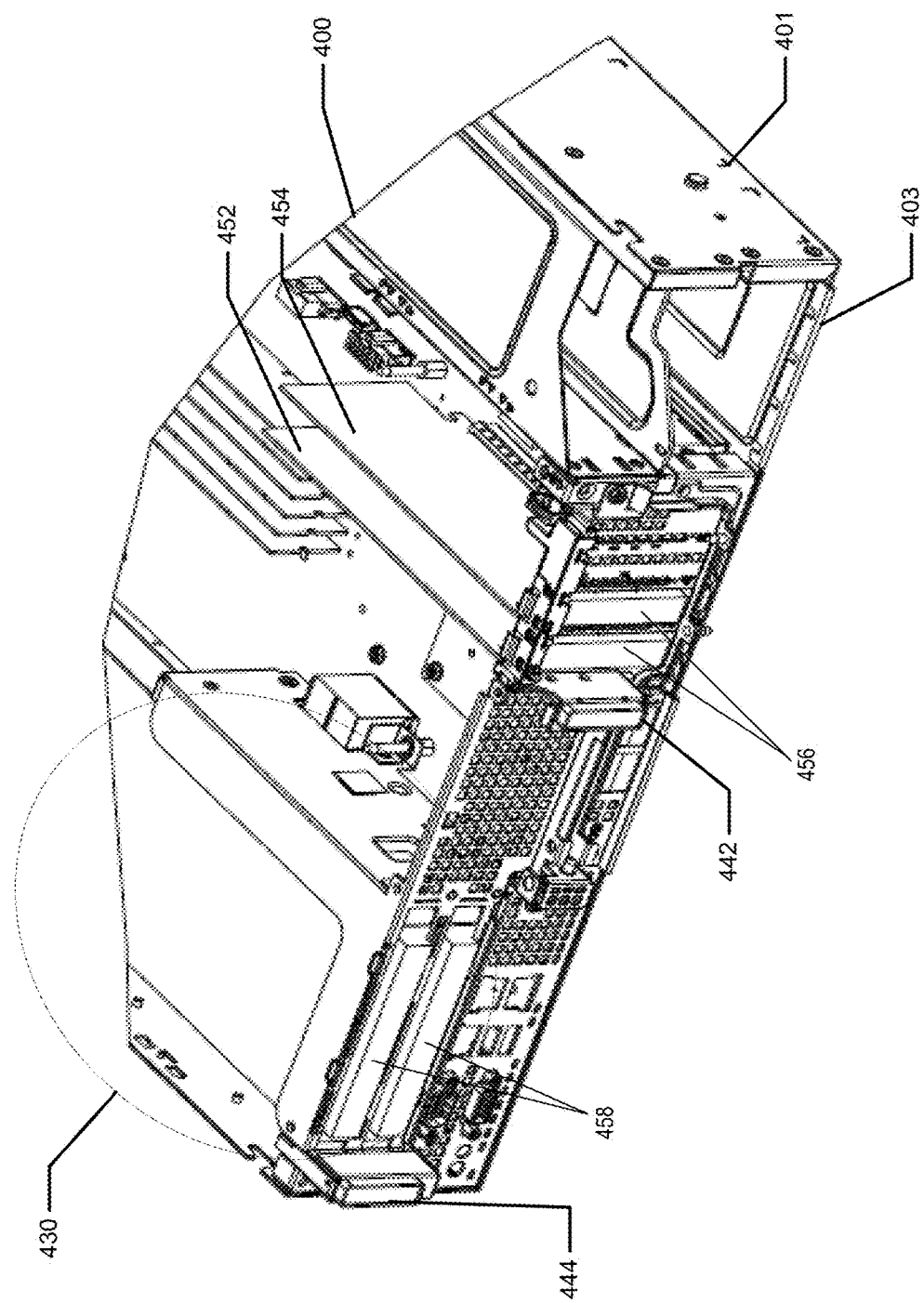

FIGS. 4a and 4b show an isometric top-side angled view of server portion 400. Server portion 400 is physically defined by server chassis portion 401. FIG. 4a shows server 400 portion unpopulated with peripheral devices; that is slots of server 400 portion are unpopulated with peripheral devices. FIG. 4b shows server 400 portion populated with peripheral devices; that is slots of server 400 portion are populated with peripheral devices. 403 indicates a back of server portion 400. Server 400 portion includes vertical riser 430 which may include auxiliary slots to hold one or more peripheral devices.

FIG. 4a shows unpopulated slots 412 and 414 with corresponding peripheral card connectors 422 and 424. Physically appended to back 403 of server chassis portion 401 is display 442 corresponding to slots 412 and 414. Display 442 is directly mounted to server chassis portion 401 by a display housing or mounting which may be considered to form part of server chassis portion 401. As can be seen from FIG. 4a, display 442 is proximate to or in the immediate vicinity of slots 412 and 414. Vertical riser 430 includes horizontal slots 432 and 434. As can be seen from FIG. 4a, display 444 abuts slots 432 and 434. Display 444 is directly mounted to server chassis portion 401 by a display housing or mounting which may be considered to form part of server chassis portion 401. Display 444 displays information corresponding to slots 432 and 434.

FIG. 4b shows slots 412 and 414 populated with peripheral devices 452 and 454 which obscure slots 412 and 414 in the view provided by FIG. 4b. As can be seen from FIG. 4b, portions of peripheral devices 452 and 454 extend through server chassis portion 401 at 456 proximate display 442 such that display 442 abuts peripheral devices 452 and 454 at 456 at server back 403. In FIG. 4b, riser 430 is populated by peripheral devices which protrude through slots 432 and 434 at 458 such that display 444 abuts the peripheral devices.

Figure 5:
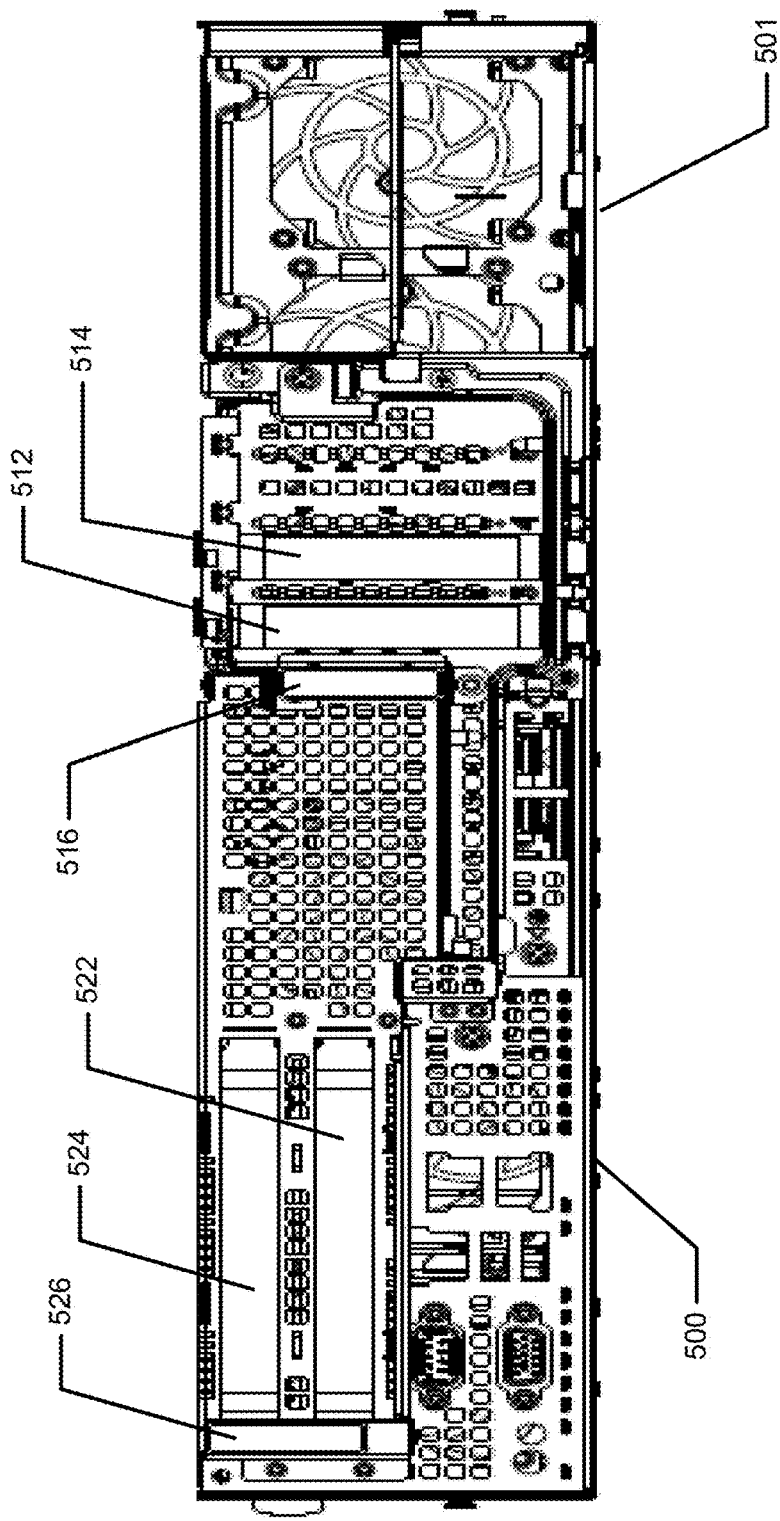
FIG. 5 illustrates a back view of a server according to an embodiment of the present disclosure.

FIG. 5 shows a back view of server 500. Server 500 is physically defined by server chassis 501 of server 500. As can be seen from FIG. 5, there are four slots in server 500 and server chassis 501: 512 and 514, and 522 and 524. Displays 516 and 526 are mounted on server chassis 501. Slots 512 and 514 are parallel slots and abutted by display 516 which displays information pertaining to slots 512 and 514. Slots 522 and 524 are parallel slots and abutted by display 526 which displays information pertaining to slots 522 and 524.

Figure 6:
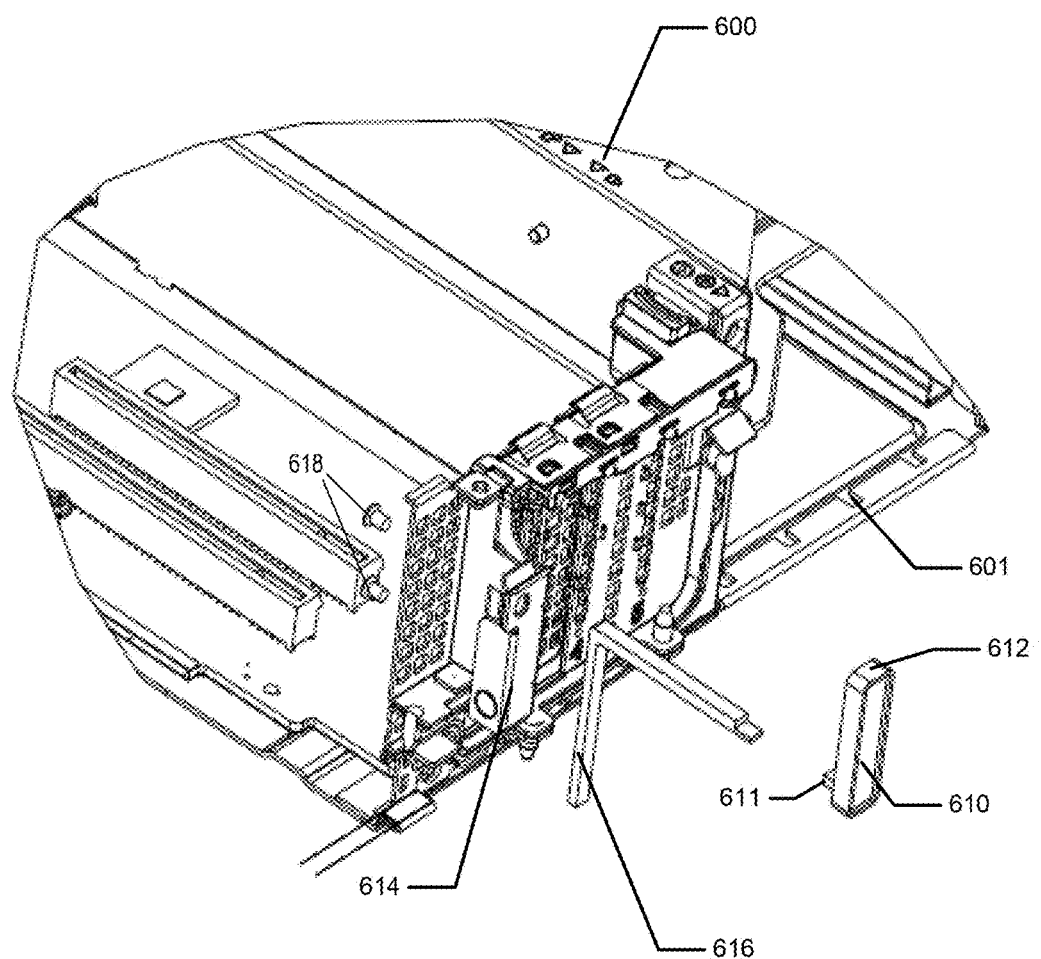
FIG. 6 illustrates a top isometric view of a server portion and display according to an embodiment of the present disclosure.

FIG. 6 is a top isometric view of server portion 600 and illustrates coupling a display to a back of a server. Server portion 600 includes server chassis portion 601 onto which a display 610 is mounted. Display 610 is provided, for example housed, in display housing 612. Display housing 612 is mechanically coupled to, for example mounted on, display mount 614 which is coupled to server chassis portion 601, to directly mount display 610 on server chassis portion 601. Display housing 612 and thus display 610 are coupled to display mount 614 by fasteners 618. Electrical connector 616 electrically connects display 610 to a motherboard of server portion 600, and via, the motherboard, to a BMC of server portion 600. Electrical connector 616 may be a rigid connector with a flex. That is, electrical connector 616 may be a component with a defined shape and the shape may be deformable to provide a flex connection solution, such as flexible PCB or a discrete wire cable with plugs on both ends. Display 610 has a display connector 611 to connect to electrical connector 616. The motherboard will have a similar connector interface to 616 (not shown).

Figure 7:
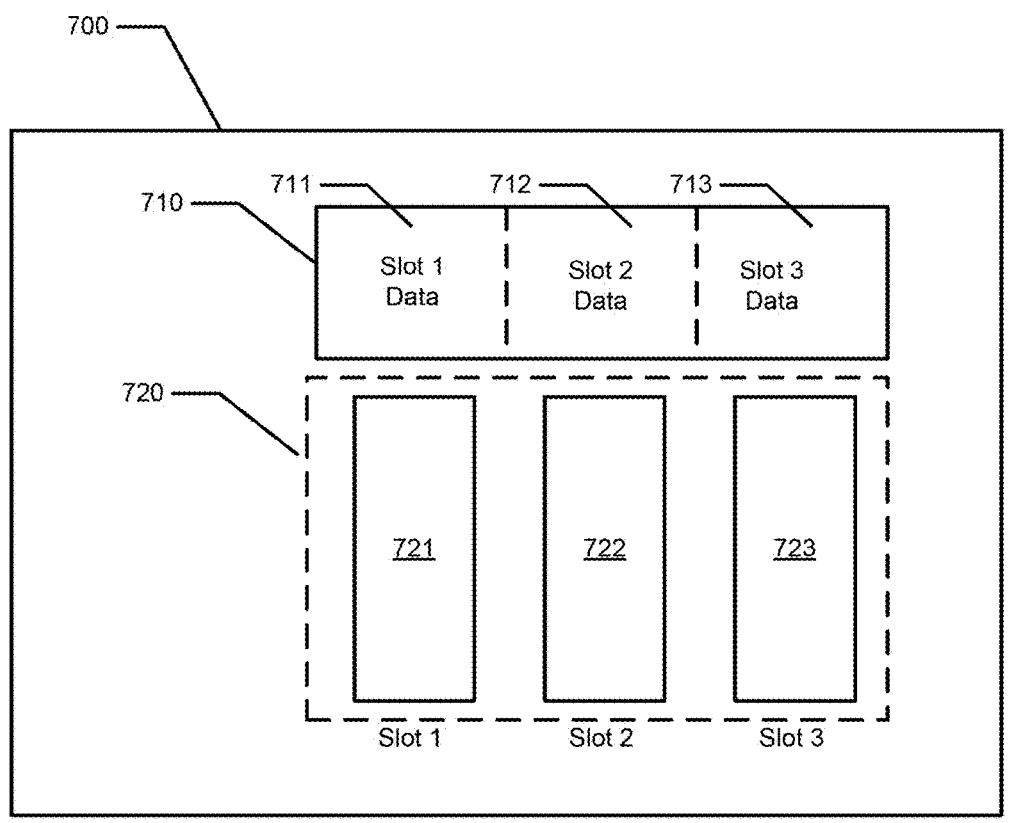
FIG. 7 illustrates a back view of a server according to an embodiment of the present disclosure.

FIG. 7 is a back view of server 700. Server 700 includes display 710 mounted on the back of server 700 and a set of slots 720 (slots 1-3), shown on the back of server 700 in FIG. 7. Each of slots 1-3 has a corresponding peripheral card connector supporting one or more communication protocols and varying communication speeds. A BMC of server 700 (not shown) is aware of these supported communication protocols and varying communication speeds. When slots 1-3 are populated with peripheral devices, the peripheral device and server 700 communicate according to one of the supported communication protocols and communication speeds. The BMC is aware of the communication protocol and communication speed used to communicate between server 700 and a peripheral device populating a slot of slots 1-3.

Further, the BMC of server 700 is connected to and controls display 710 to cause display 710 to output information on display 710. As can be seen from FIG. 7, display 710 abuts the set of slots 720 and thus each of slots 1-3. A portion of display 710 is thus proximate each slot of slots 1-3. Display 710 may be divided into display portions 711-713. Display portion 711 abuts and is proximate slot 1 (slot 721). Display portion 712 abuts and is proximate slot 2 (slot 722). Display portion 713 abuts and is proximate slot 3 (slot 723).

Display portion 711 displays information pertaining to slot 1 (slot 721) as controlled by the BMC of server 700. Display portion 712 displays information pertaining to slot 2 (slot 722) as controlled by the BMC of server 700. Display portion 713 displays information pertaining to slot 3 (slot 723) as controlled by the BMC of server 700. Each of display portions 711-713 may display different types of information relating to corresponding slots 721-723: slot characteristics, slot status or user defined information. A user may interface with the BMC to display different types of information on display 710 and individual display portions 711-713.

For example, the BMC of server 700 may control display 710 to display slot characteristics of slot 1 in display portion 711 corresponding to slot 1. Slot characteristics may include the communication protocols supported by the slot, the communication speeds supported by the slot, the type of slot, the type of card connector of the slot, or other slot characteristics. A communication protocol may be various Peripheral Component Interconnect Express (PCIe) variants, for example.

For example, the BMC of server 700 may control display 710 to display slot status information of slot 2 in display portion 712 corresponding to slot 2. Slot 2 may be populated with a peripheral device and the peripheral device may be communicating with server 700 according to one or more protocols at one or more speeds or may be in negotiations with server 700 or undergoing initialization by server 700. Slot characteristics may include the protocol used to communicate with the peripheral device, communication speed, the state of the peripheral device such as operable or in configuration, or other status information related to the peripheral device.

For example, the BMC of server 700 may control display 710 to display user defined information of slot 3 in display portion 713 corresponding to slot 3. Slot 3 may be populated with a peripheral device such as a network card and as such may be in communication with particular networks or coupled to a particular switch fabric. A user may communicate with the BMC controlling display 710 to cause display portion 713 to display a particular network indication, network group, or connection type.

As discussed above, slots may be universal slots and the peripheral card connector of the slots may have a common connection footprint. While a universal slot may have a standard or universal, that is common, physical footprint, and common connector, the configuration of the slots may vary, and protocols supported by the slots may vary. For example, a slot and corresponding connector may support a set of protocols, such as communication protocols, and may be configured for a protocol of the set of supported protocols. Thus because slots generally have a common physical footprint and connector, an associated display portion as disclosed above allows for identification of slot capabilities and configurations for individual slots.

For example, a slot and corresponding connector may support the server communicating with a peripheral device installed in the slot according to a set of communication protocols including protocols and speeds such as: PCI Generations 3 and 4, Enhanced Modes of PCI Gen 4 (with varying communication speeds), Cache Coherence Interconnect for Acclerators (CCIX), and various future interconnect protocols at varying communication speeds. Slots may also be associated with particular server components such as specific dies or processors. In addition individual slots may have specific power or cooling considerations. Slot performance may also degrade over time, thus reducing communication speeds supported by the slot, for example. The display portion associated with an individual slot may be used to provide such information regarding the slot.

Figure 8A:
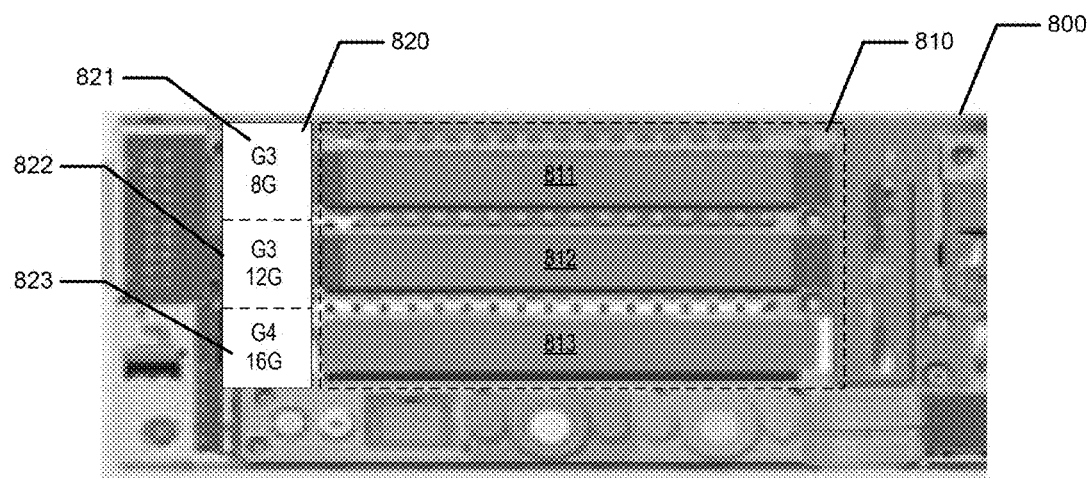
FIGS. 8a and 8b illustrate a back view of a server according to an embodiment of the present disclosure.
Figure 8B:
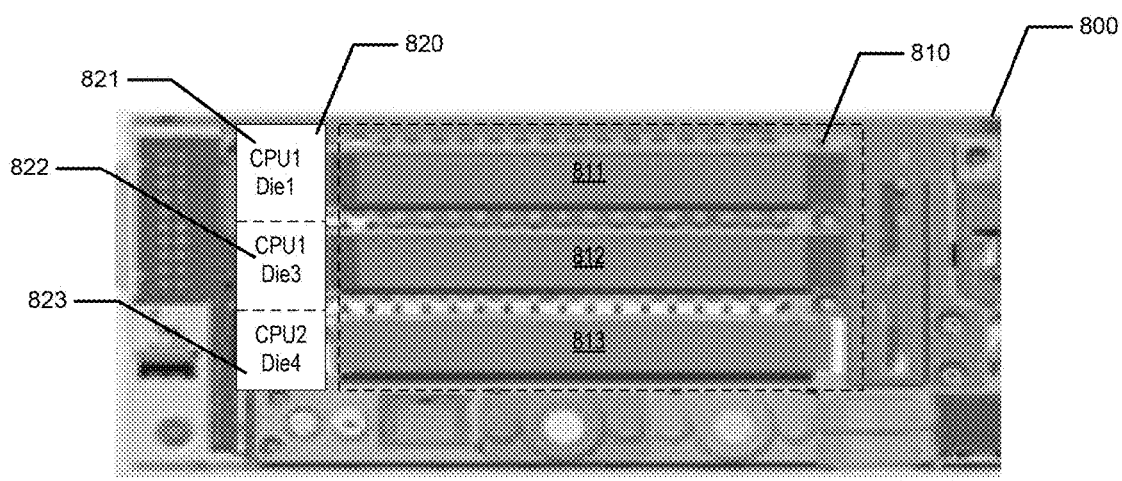

FIGS. 8a and 8b show a back of a server 800. Server 800 includes a set of slots 810 and a corresponding display 820 proximate and abutting slots 810. Slots 810 include slots 811 (slot 1),812 (slot 2) and 813 (slot 3). Display 820 includes display portions 821, 822 and 823 corresponding to slots 811-813, respectively. That is display portion 821 corresponds to slot 811 and display information related to slot 811. Similarly, display portion 822 corresponds to slot 812 and display information related to slot 812, and display portion 823 corresponds to slot 813 and display information related to slot 813.

In FIG. 8a, slot 811 is configured for PCIe generation 3 and supports a communication speed of 8 Gbps (as indicated in corresponding display portion 821) such that a peripheral device installed in slot 811 will communicate with the server per PCIe generation 3 at 8 Gbps. Slot 812 is configured for PCIe generation 4 and the peripheral card connector of slot 812 supports a higher communication speed of 16 Gbps (as indicated in corresponding display portion 822) such that a peripheral device installed in slot 812 will communicate with the server per PCIe generation 4 at up to 16 Gbps. Slot 813 is configured for PCIe generation 4 and support communication speeds up to 25G (as indicated in corresponding display portion 822).

In FIG. 8b, slot 811 is supported by and in communication with server central processing unit (CPU) 1, and die 1 of CPU 1, as indicated in corresponding display portion 821. Slot 812 is supported by and in communication with server CPU 1, and die 3 of CPU 1, as indicated in corresponding display portion 822. And slot 813 is supported by and in communication with server CPU 2, and die 4 of CPU 2, as indicated in corresponding display portion 823.

Figure 9:
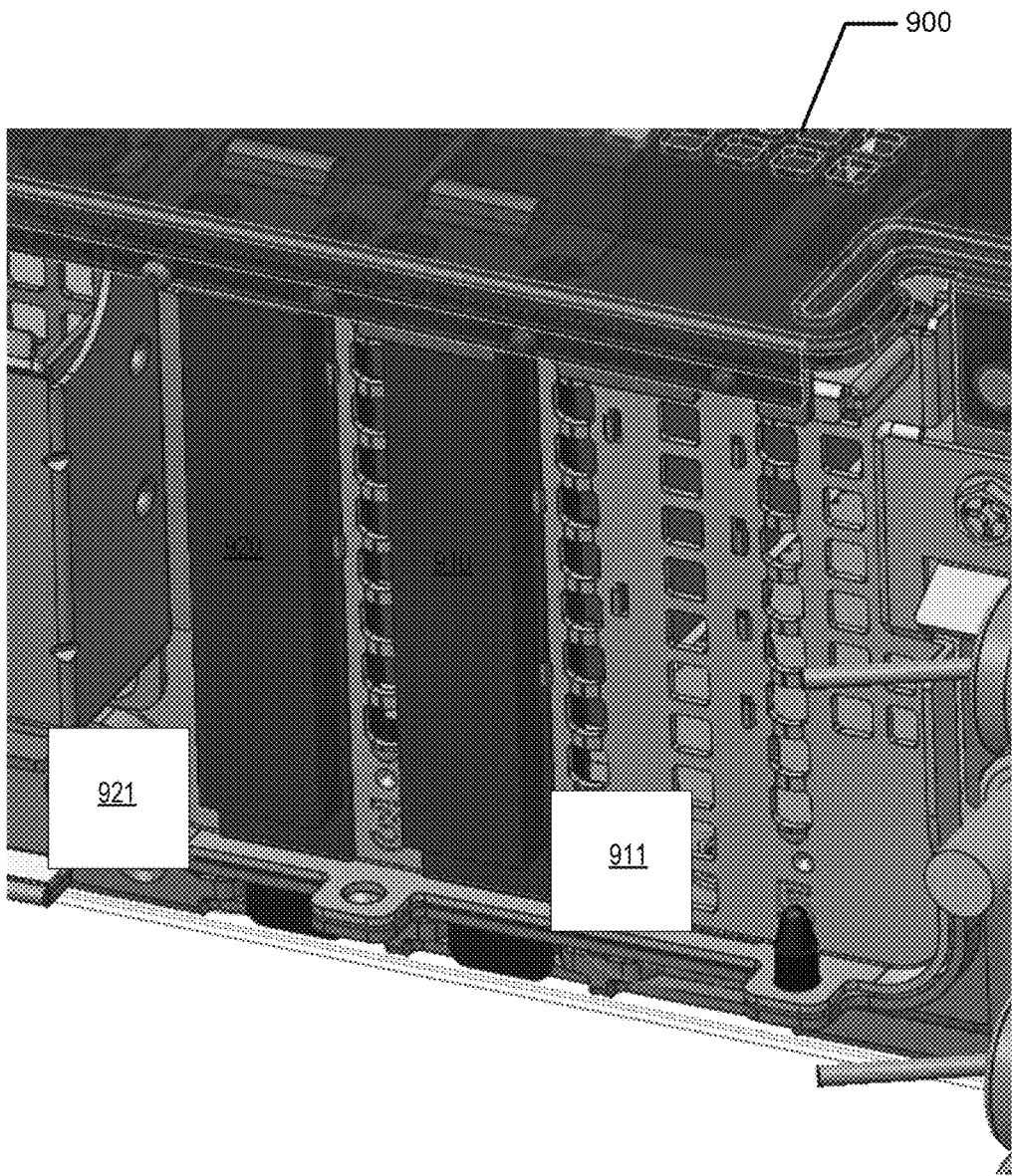
FIG. 9 illustrates a back view of a server according to an embodiment of the present disclosure.

FIG. 9 shows a back view of a server 900. Server 900 includes slots 910 and 920, and LED displays 911 and 921. LED displays 911 and 921 comprise LEDs and may vary color or blink rate to indicate different protocols or speeds associated with slots. For example, LED display 911 is associated with slot 910 and displays information regarding slot 910 by way of visual LED display of colors or blink rates. Similarly, LED display 921 is associated with slot 920 and displays information regarding slot 920 by way of visual LED display of colors or blink rates.

A display may have or be configured to have both static and dynamic display capabilities. For example, with regard to dynamic display capabilities, a display may dynamically display when a hot plug of a device occurs or an adapter is changed; a display may also display a current negotiated speed between CPU and adapter, or a link speed of link retrained at a lower speed sometime after the system has been running at a higher speed. The display may further display topology details, for example, CPU to repeater to switch to slot, or CPU direct to slot.

The display may also have the ability to remember and display slot information even when server does not have power applied via "liquid paper" or E-ink or other. The display may further display a display of optimal versus sub-optimal configuration feedback information. The display may further display of differing capabilities of an individual slot as a function of CPU SKU, Riser type, or other. The display may further display indications of elements installed or various display modes of the display.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A server comprising:
   a set of slots for adding peripheral devices to the server;
   a server chassis having a set of openings corresponding to the set of slots; and
   a display mounted on the server chassis adjacent to the set of openings, the display divided into display portions, each display portion configured to display slot characteristics, slot status information, and user defined information corresponding to a slot of the set of slots, wherein the slot is adjacent to the display portion.

2. The server of claim 1, wherein the display is a part of a display housing and the display housing is mounted to the server chassis.

3. The server of claim 2, further comprising a display mount positioned on the server chassis, wherein the display housing is mounted on the display mount.

4. The server of claim 1, further comprising a baseboard management controller (BMC), wherein the display is connected to the BMC to be controlled by the BMC.

5. The server of claim 1, wherein the set of openings includes a first opening corresponding to a first slot of the set of slots, and a first portion of the display adjacent to the first opening displays information regarding the first slot.

6. The server of claim 5, wherein the set of openings includes a second opening corresponding to a second slot of the set of slots, and a second portion of the display adjacent to the second opening displays information regarding the second slot.

7. The server of claim 1, wherein each slot includes a peripheral card connector.

8. The server of claim 1, wherein slot characteristics include a communication protocol supported by the slot.

9. An information handling system comprising:
   a set of slots for adding peripheral devices to the information handling system;
   a chassis having a set of openings corresponding to the set of slots; and
   a display mounted on the chassis, the display configured to display first textual information associated with the set of slots, wherein the first textual information includes slot characteristics, slot status information, and user defined information, wherein the display is configured to dynamically display second textual information in response to the adding peripheral devices, wherein the second textual information is associated with the peripheral devices.

10. The information handling system of claim 9, wherein each slot of the set of slots includes a peripheral card connector.

11. The information handling system of claim 9, wherein the display is positioned adjacent to the set of openings.

12. The information handling system of claim 9, further comprising a baseboard management controller (BMC), wherein the display is connected to the BMC to be controlled by the BMC.

13. The information handling system of claim 9, wherein the set of openings includes a first opening corresponding to a first slot of the set of slots, and a first portion of the display adjacent to the first opening displays information regarding the first slot.

14. The information handling system of claim 13, wherein the first slot includes a first peripheral card connector, and the first portion displays information regarding the first peripheral card connector.

15. The information handling system of claim 13, wherein the set of openings includes a second opening corresponding to a second slot of the set of slots, and a second portion of the display adjacent to the second opening displays information regarding the second slot.

16. The information handling system of claim 15, wherein the second slot includes a second peripheral card connector and is populated by a peripheral device, and the second portion displays information regarding the peripheral device.

17. The information handling system of claim 15, wherein slot status information includes communication speed corresponding to the second slot.

18. A server comprising:
 a set of slots for adding peripheral devices to the server, each slot of the set of slots including a respective peripheral card connector;
 a server chassis having a set of openings corresponding to the set of slots;
 a baseboard management controller (BMC); and
 a display mounted on the server chassis, the display connected to the BMC to be controlled by the BMC and abutting the set of slots, the display configured to display textual information associated with the set of slots, wherein the textual information includes slot characteristics, slot status information, and user defined information, wherein the display is semi-permanent to maintain the textual information even when the server does not have power.

19. The server of claim 18, wherein the set of openings includes a first opening corresponding to a first slot of the set of slots, and a first portion of the display adjacent to the first opening displays a communication protocol and a communication speed supported by the first slot.

20. The server of claim 18, wherein the set of openings includes a first opening corresponding to a first slot of the set of slots, the first slot is populated by a first peripheral device connected to the respective peripheral card connector, and a first portion of the display adjacent to the first opening displays a communication speed negotiated between the server and the first peripheral device.

* * * * *